United States Patent
Kim et al.

(10) Patent No.: US 7,495,311 B2
(45) Date of Patent: Feb. 24, 2009

(54) SEMICONDUCTOR DEVICES HAVING A METAL-INSULATOR-METAL CAPACITOR AND METHODS OF FORMING THE SAME

(75) Inventors: Hyun-Ho Kim, Seoul (KR); Heung-Jin Joo, Gyeonggi-do (KR); Ki-Nam Kim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/180,954

(22) Filed: Jul. 12, 2005

(65) Prior Publication Data

US 2006/0006447 A1  Jan. 12, 2006

(30) Foreign Application Priority Data

Jul. 12, 2004  (KR) .................. 10-2004-0054049

(51) Int. Cl.
 *H01L 29/94* (2006.01)
(52) U.S. Cl. .................. 257/532; 257/E21.648; 438/396
(58) Field of Classification Search .................. None
 See application file for complete search history.

(56) References Cited

U.S. PATENT DOCUMENTS

| 5,278,091 | A |   | 1/1994 | Fazan et al. | |
| 5,392,189 | A | * | 2/1995 | Fazan et al. | 361/305 |
| 5,505,816 | A | * | 4/1996 | Barnes et al. | 438/695 |
| 5,789,320 | A |   | 8/1998 | Andricacos et al. | |
| 6,210,595 | B1 | * | 4/2001 | Weinrich et al. | 216/70 |
| 6,576,053 | B1 | * | 6/2003 | Kim et al. | 117/89 |
| 6,642,564 | B2 | * | 11/2003 | Ogawa et al. | 257/296 |
| 2002/0028552 | A1 | * | 3/2002 | Lee et al. | 438/243 |
| 2002/0089009 | A1 | * | 7/2002 | Kitamura | 257/306 |
| 2003/0151083 | A1 | * | 8/2003 | Matsui et al. | 257/310 |
| 2004/0043578 | A1 | * | 3/2004 | Marsh | 438/396 |

FOREIGN PATENT DOCUMENTS

| JP | 7-211798 | 8/1995 |
| KR | 1996-073916 | 12/1996 |
| KR | 2001-001370 | 1/2001 |
| KR | 2003-0042268 | 5/2003 |
| KR | 10-0395767 | 8/2003 |

OTHER PUBLICATIONS

English language abstract of Korean Publication No. 2001-001370.
English language abstract of Korean Publication No. 2003-0042268.
English language abstract of the Korean Publication No. 1996-073916.
English language abstract of the Korean Publication No. 10-0395767.

* cited by examiner

*Primary Examiner*—Evan Pert
*Assistant Examiner*—Ben P Sandvik
(74) *Attorney, Agent, or Firm*—Marger Johnson & McCollom, P.C.

(57) ABSTRACT

A semiconductor device having an MIM capacitor and a method of forming the same are provided. A lower electrode includes a plate electrode and a sidewall electrode. The plate electrode is formed by a patterning process preferably including a plasma anisotropic etching. The sidewall electrode is formed like a spacer on an inner sidewall of an opening exposing the plate electrode by a plasma entire surface anisotropic etching.

13 Claims, 5 Drawing Sheets

Fig. 1

(PRIOR ART)

Fig. 2

(PRIOR ART)

SEMICONDUCTOR DEVICES HAVING A METAL-INSULATOR-METAL CAPACITOR AND METHODS OF FORMING THE SAME

CROSS-REFERENCE TO RELATED APPLICATIONS

This U.S. non-provisional patent application claims priority under 35 U.S.C. § 119 of Korean Patent Application 2004-54049 filed on Jul. 12, 2004, the entire contents of which are hereby incorporated by reference.

BACKGROUND OF THE INVENTION

The present invention relates to a semiconductor device and a method of forming the same and specifically to a semiconductor device including a Metal-Insulator-Metal (MIM) capacitor and a method of forming the same.

A semiconductor capacitor has been widely used as a data storage of unit cells in a DRAM device, a ferroelectric memory device, etc. because of its characteristic of storing electrons. Conventionally, the capacitor includes upper and lower electrodes and a dielectric layer intervening between the upper and lower electrodes. As a capacity of the capacitor increases, the capacitor stores more electrons.

Electrodes of an MIM capacitor of a semiconductor device are formed of metal. Especially, an MIM capacitor having noble metal electrodes has been proposed to prevent reactions between a dielectric layer and electrodes. As semiconductor devices are more highly integrated, a size of the MIM capacitor decreases. Thus, various methods are developed for increasing capacitance of the capacitor within a limited area. U.S. Pat. No. 5,392,189 discloses one method of increasing an area of a lower electrode formed of platinum (Pt). This will be briefly explained with reference to FIGS. 1 and 2.

Figure 1:
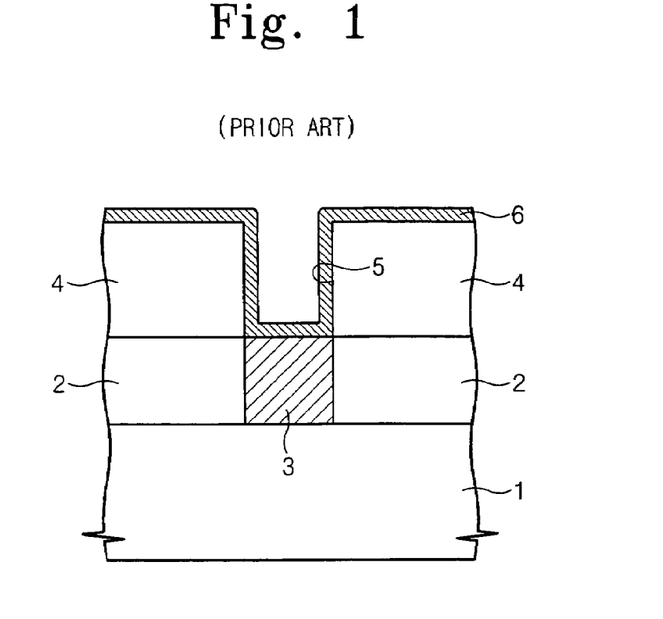
FIGS. 1 and 2 are cross-sectional views showing a method of forming a conventional MIM capacitor in accordance with an example of the present invention.
Figure 2:
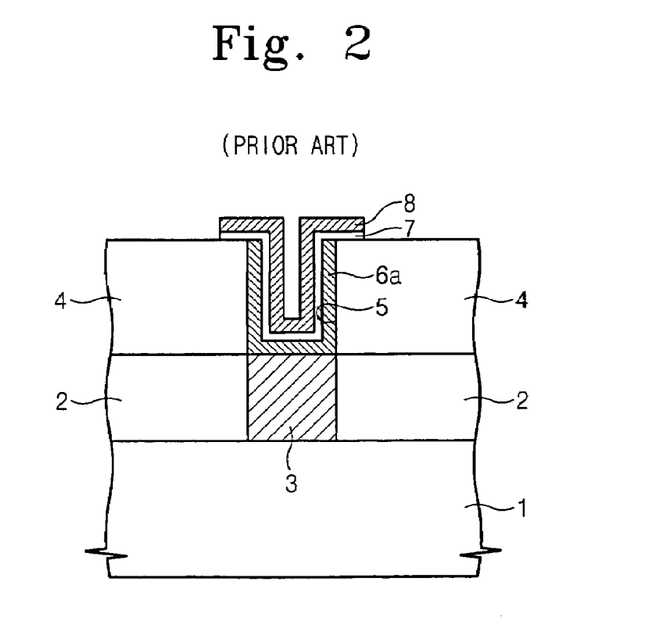

FIGS. 1 and 2 are cross-sectional views for showing a method of forming a conventional MIM capacitor.

Referring to FIG. 1, a first insulation layer 2 is formed on a semiconductor substrate 1 and a plug 3 is formed to contact the semiconductor substrate 1 via the lower oxide layer 2. A second insulation layer 4 is formed over an entire surface of the semiconductor substrate 1 and the second insulation layer 4 is patterned to form an opening 5 exposing the plug 3.

A platinum layer 6 is formed over the semiconductor substrate 1 having the opening 5. In this case, the platinum layer 6 does not fill the opening 5 but lies on a bottom surface and a sidewall of the opening 5.

Referring to FIG. 2, the platinum layer 6 is polished using a chemical mechanical polishing process sufficiently to expose a top surface of the second insulation layer 4, thereby forming a lower electrode 6a in the opening 6.

A dielectric layer 7 and an upper electrode 8 are formed on the lower electrode 6a. The lower electrode 6a, the dielectric layer 7 and the upper electrode 8 compose a capacitor. The lower electrode 6a is formed to have a concave shape in the opening 5, such that overlapped area between the lower and lower electrodes 6a and 8 increases. That is, an inner sidewall area of the lower electrode 6a and a bottom area correspond to the overlapped area of the lower and upper electrodes 6a and 8. Therefore, the capacitance of the capacitor per substrate area increases.

In the above method of forming a conventional capacitor, the lower electrode 6a is formed through a chemical mechanical polishing (CMP) process applied to the deposited platinum layer 6. However, it is very difficult to polish noble metal layers including the platinum layer 6 using chemical mechanical polishing because of lack of developed slurries, etc. Therefore, pattern defects may occur in the lower electrode 6a. In addition, residues of the platinum layer 6 may remain atop the second insulation layer 4 to cause a bridge between neighboring lower electrodes 6a. As a result, yield can be largely degraded due to defects of semiconductor device.

SUMMARY OF THE INVENTION

An aspect of the present invention is to provide a semiconductor device having an MIM capacitor capable of preventing defects of a lower electrode or/and bridges of lower electrodes and a method of fabricating the same.

Another aspect of the present invention is to provide a semiconductor device having an MIM capacitor in a structure not requiring a CMP process and a method of fabricating the same.

The present invention is directed to a semiconductor device having a transistor.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, it will be described about an exemplary embodiment of the present invention in conjunction with the accompanying drawings.

Figure 3:
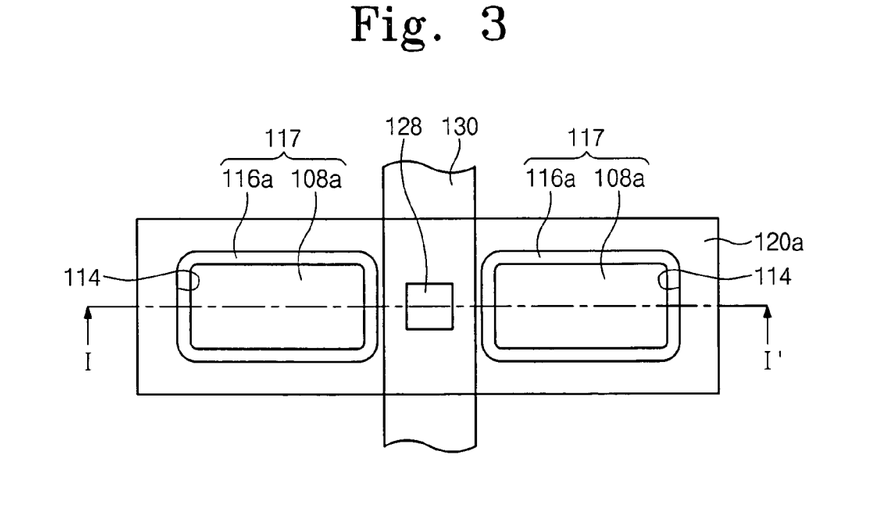
FIG. 3 is a top plan view showing a semiconductor device having an MIM capacitor in accordance with an embodiment of the present invention.
Figure 4:
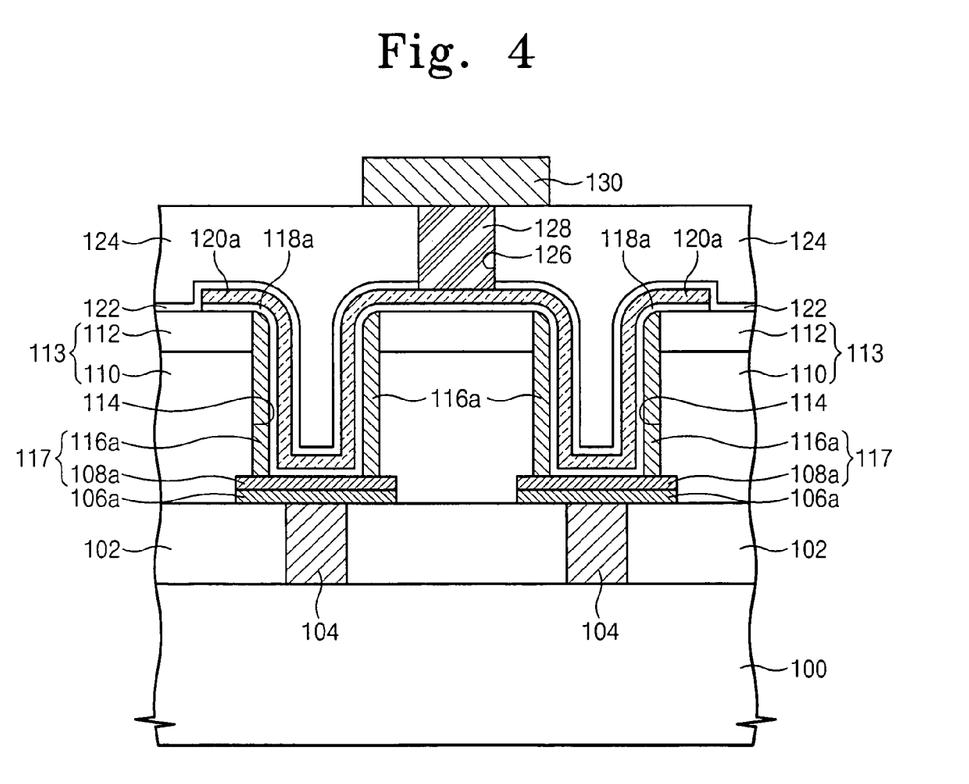
FIG. 4 is a cross-sectional view taken along a line I-I' in FIG. 3.

FIG. 3 is a top plan view showing a semiconductor device having an MIM capacitor and FIG. 4 is a cross-sectional view taken along a line I-I' in FIG. 3.

Referring to FIGS. 3 and 4, a lower interlayer insulation layer 102 is disposed on a semiconductor substrate 100 (hereinafter, referred to as 'a substrate') and a contact plug 104 penetrates the lower interlayer insulation layer 102 to contact the substrate 100. A plurality of contact plugs 104 may be disposed in the lower interlayer insulation layer 102. In the drawing, a couple of contact plugs 104 are illustrated. The lower interlayer insulation layer 102 may be formed of silicon oxide or other dielectric known in the art. The contact plug 104 may be formed of a conductive layer such as a doped polysilicon layer or a tungsten layer.

A plate electrode 108a is disposed to cover the contact plug 104. The plate electrode 108a contacts the contact plug electrically. The plate electrode 108a is formed of conductive materials including noble metals. For instance, the plate electrode 108a may be formed of one or more metals selected from the group consisting of Palladium (Pd), Ruthenium (Ru), Platinum (Pt), Iridium (Ir), Iridium oxide (IrO2), and Ruthenium oxide (RuO2) or a combination thereof.

An oxygen barrier pattern 106a may be interposed between the top electrode 108a and the contact plug 104. The oxygen barrier pattern 106a may be formed of conductive materials having good oxygen resistance. Therefore, the plate electrode 108a contacts the contact plug 104 electrically through the oxygen barrier pattern 106a. In addition, an upper portion of the contact plug 104 may be prevented from oxidation due to the oxygen barrier pattern 106a. The oxygen barrier pattern 108a may be formed of conductive metal nitride materials. For example, the oxygen barrier pattern 108a may be formed of one of a tantalum nitride layer, a titanium nitride layer, and a titanium aluminum nitride layer or a combination layer thereof.

When a bottom surface of the plate electrode 108a is formed of a noble metal layer such as a ruthenium oxide layer or an iridium oxide layer, the oxygen barrier pattern 106a can be omitted. Thus the plate electrode 108a may directly contact the contact plug 104. The noble metal layer such as the ruthenium oxide layer or the iridium oxide layer itself can serve as an oxidation barrier layer.

A mold layer 113 covers an entire surface of the substrate 100. The mold layer 113 includes an opening 114 exposing an upper surface of the plate electrode 108a. Openings 114 each corresponding to the contact plugs 104 are disposed in the mold layer 113. At least an upper portion of the mold layer may be formed of a growth-promote insulation layer 112. That is, the mold layer 113 can include an intermediate interlayer insulation layer and a growth-promote insulation layer 112 that are sequentially stacked. The intermediate interlayer insulation layer 110 may be formed of a silicon oxide layer, a silicon oxynitride layer or a silicon nitride layer. Layer 112 is further described below with reference to FIG. 9.

A spacer-shaped sidewall electrode 116a is disposed on an inner sidewall of the opening 114. The sidewall electrode 116a forms a shaped of an opened cylinder. The sidewall electrode 116a contacts the plate electrode 108a electrically, which is exposed in the opening 114. Specifically, the sidewall electrode 116a contacts edges of a top surface of the exposed plate electrode 108a. The sidewall electrode 116a may be formed of conductive materials including noble metals. For instance, the sidewall electrode 116a may be formed of one or more metals selected from the group consisting of Palladium (Pd), Ruthenium (Ru), Platinum (Pt), Iridium (Ir), Iridium oxide (IrO2), and Ruthenium oxide (RuO2) or a combination thereof. The plate electrode 108a and the sidewall electrode 116a together compose a lower electrode 117.

The upper electrode 120a covers the lower electrode 117 and a dielectric pattern 118a intervenes between the lower electrode 117 and the upper electrode 120a. The dielectric pattern 118a covers the lower electrode 117 entirely. That is, the dielectric pattern 118a and the upper electrode 120a cover the plate electrode 108a and the sidewall electrode 116a in order. The lower electrode 117, the dielectric pattern 118a and the upper electrode 120a together compose a capacitor.

As illustrated in FIG. 3, the upper electrode 120a may be an island-shaped in a plan view. In the drawings, the upper electrode 120a is illustrated as an island covering a couple of neighboring lower electrodes 117.

The upper electrode 120a may be formed of conductive materials including noble metals. For instance, the upper electrode 120a may be formed of one selected from the group consisting of Palladium (Pd), Ruthenium (Ru), Platinum (Pt), Iridium (Ir), Iridium oxide (IrO2), and Ruthenium oxide (RuO2) or a combination thereof. The dielectric pattern 118a may be a high-k dielectric layer having a dielectric constant higher than that of the silicon nitride layer. For example, the dielectric pattern 118a may be formed of a metal oxide layer such as a hafnium oxide layer. Alternatively, the dielectric pattern 118a may be formed of a dielectric layer such as a single layer or a multi layer comprising of PZT, SBT, BLT, etc.

The growth-promote insulation layer 112 is formed of an insulation layer which promotes a growth of the dielectric pattern 118a. In addition, the growth-promote insulation layer 112 may be formed of the high-k dielectric layer or an insulation layer that is not reactive with a ferroelectric layer. For instance, the growth-promote insulation layer 112 may be formed by an aluminum oxide layer or a titanium oxide layer.

A hydrogen diffusion barrier layer 122 may be disposed to cover an entire surface of the substrate including over the upper electrode layer 120a and the mold layer 113. The hydrogen diffusion barrier layer 122 is formed of an insulation layer preventing hydrogen that may be present during subsequent processes from diffusing into the dielectric pattern 118a. Especially, when the dielectric pattern 118a is formed of the above examples of high-k dielectric layer, the hydrogen diffusion barrier layer 122 may be more required. For example, the hydrogen diffusion barrier layer 122 may be formed of one or more of insulation materials such as aluminum oxide, titanium oxide, silicon oxide, and silicon oxynitride or combination thereof.

An upper interlayer insulation layer 124 is disposed to cover an entire surface of the substrate. As illustrated in the drawings, when the upper electrode 120a is disposed conformally in the opening 114, the upper interlayer insulation layer 124 may fill the opening 114. Alternatively, the upper electrode 120a may fill the opening 114 (not shown). The upper interlayer insulation layer 124 may be formed, for example, of silicon oxide.

A plate contact hole 126 is disposed to penetrate the upper interlayer insulation layer 124 and the hydrogen diffusion barrier layer 122. A plate contact plug 128 is disposed to fill the plate contact hole 126. A portion of the upper electrode 120a exposed by the plate contact hole 126 may be located on a top surface of the mold layer 113. A plate line 130 electrically contacting the plate contact plug 128 is placed on the upper interlayer insulation layer 124. The plate contact plug 128 and the plate line 10 may be formed of various metals such as tungsten, aluminum, or copper. The plate contact plug 128 may be a portion of the plate line 130 extended to fill the plate contact hole 126.

In some applications, the above semiconductor device may not require the plate line 130. In this case, the upper electrode 120a may serve as the plate line 130 instead of the plate line 130. This will be explained with reference to FIG. 5.

Figure 5:
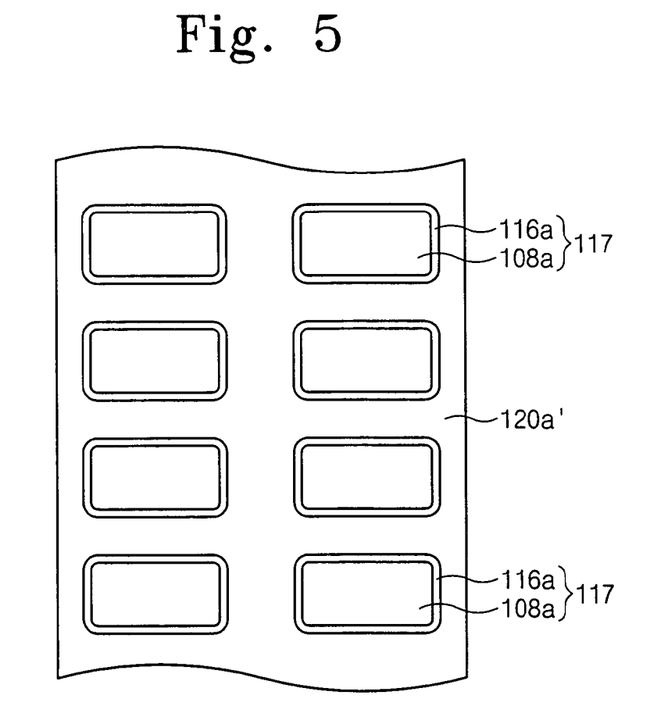
FIG. 5 is a top plan view showing a modification of a semiconductor device having an MIM capacitor in accordance with an embodiment of the present invention.

FIG. 5 is a top plan view showing a modification of a semiconductor device having an MIM capacitor in accordance with an embodiment of the present invention. Referring to FIG. 5, a plurality of lower electrodes 117 is disposed along rows and columns in two dimensions. One upper electrode 120a' is extended along a column direction to cover a couple of lower electrodes 117 at the same time. A dielectric pattern 118a as shown in FIG. 4 is interposed between the upper electrode 120a' and the lower electrodes 117.

The upper electrode 120a' serves both as an upper electrode of the capacitor by covering the lower electrodes 117 and as a plate line 130 in FIG. 4 because it provides a line shape extended along a column direction.

The upper electrode 117 comprises a plate electrode 108a and the sidewall electrode 116a in the above MIM capacitor. In this case, the sidewall electrode 116a has a spacer shape. This means that the sidewall electrode 116a does not require a conventional CMP process at all. As a result, the semiconductor device having the MIM capacitor can prevent defects or/and bridges of the lower electrode due to the conventional CMP.

The MIM capacitor having the above structure may be applied to a unit cell of a DRAM device or a ferroelectric memory cell in which the capacitor is coupled to a transistor.

Next, a method of forming a semiconductor device having the above MIM capacitor will be explained.

FIGS. 6 through 10 are cross-sectional views taken along a line I-I' in FIG. 3 showing successive steps in a method of forming a semiconductor device having an MIM capacitor in accordance with an embodiment of the present invention.

Figure 6:
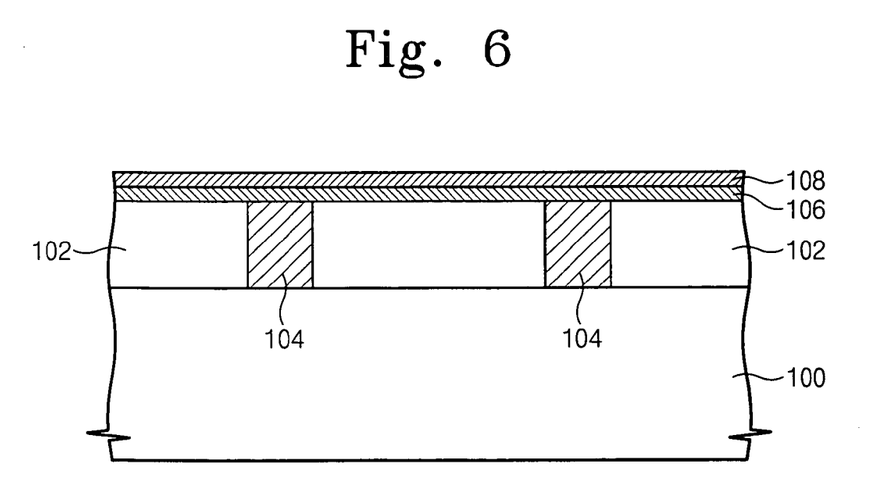
FIGS. 6 through 10 are successive cross-sectional views taken along a line I-I' in FIG. 3 for showing a method of forming a semiconductor device having an MIM capacitor in accordance with an embodiment of the present invention.

Referring to FIG. 6, a lower interlayer insulation layer 102 is formed on a substrate 100. Contact plugs 104 are formed, which penetrate the lower interlayer insulation layer 102 to contact a predetermined region of the substrate 100. The lower interlayer insulation layer 102 may be formed of a silicon oxide layer and the contact plug 104 may be formed of a conductive layer such as a doped polysilicon layer or a tungsten layer.

An oxygen barrier layer 106 and a first conductive layer 108 are formed sequentially on the substrate 100. The oxygen barrier layer 106 may be formed of a conductive material layer having good oxidation resistance. For instance, the oxygen barrier layer 106 may be formed of a conductive metal nitride layer such as a titanium nitride layer, a tantalum nitride layer and the titanium aluminum nitride layer or a combination thereof. The first conductive layer 108 is formed of conductive materials which preferably include noble metals. For example, the first conductive layer 108 may be formed of a metal or metallic compound selected from the group consisting of Palladium (Pd), Ruthenium (Ru), Platinum (Pt), Iridium (Ir), Iridium oxide (IrO$_2$), and Ruthenium oxide (RuO$_2$) or a combination thereof.

Figure 7:
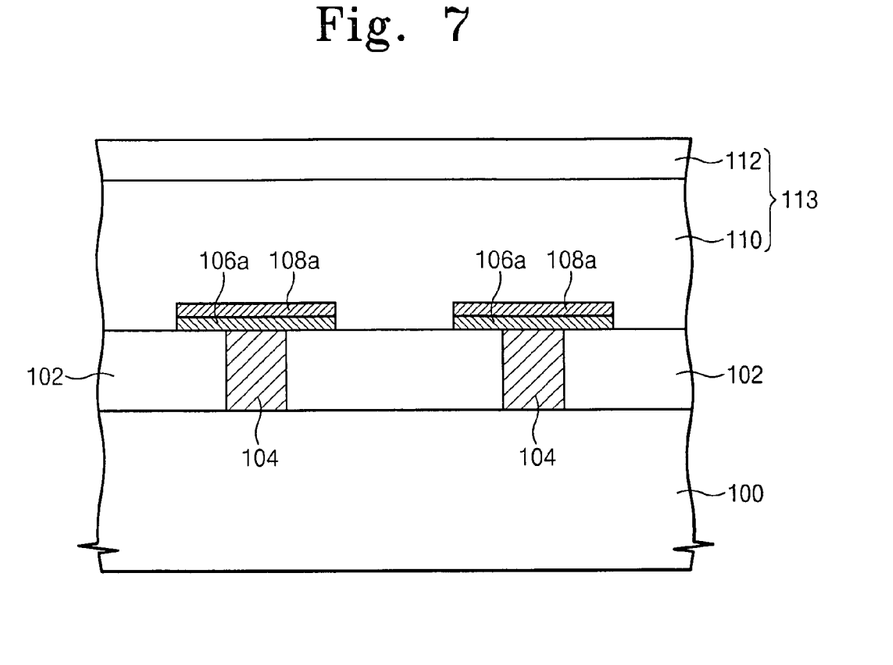

Referring to FIG. 7, the first conductive layer 108 and the oxygen barrier layer 106 are successively patterned to form an oxygen barrier pattern 106a and a plate electrode 108a that are sequentially stacked on the contact plug 104. The patterning process includes a photolithography process and a plasma anisotropic etch process. The plasma anisotropic etch process is used for etching the first conductive layer 108 and the oxygen barrier layer 106. As described above, the oxygen barrier pattern 106a can prevent the contact plug 104 from oxidation. When a bottom surface of the plate electrode 108a is formed of a noble metal oxide layer, such as an iridium oxide layer or a ruthenium oxide layer, the oxidation barrier layer 106 need not be formed.

A mold layer 113 is formed on an entire surface of the substrate 100 having the plate electrode 108a. At least, an upper portion of the mold layer 113 may be formed as a growth-promote insulation layer 112. For instance, the mold layer 113 may be formed by depositing an intermediate interlayer insulation layer 110 and a growth-promote insulation layer 112 that are sequentially stacked. The intermediate interlayer insulation layer 110 may be formed of a single layer or a multilayer such as a silicon oxide layer, a silicon oxynitride layer or a silicon nitride layer.

Figure 8:
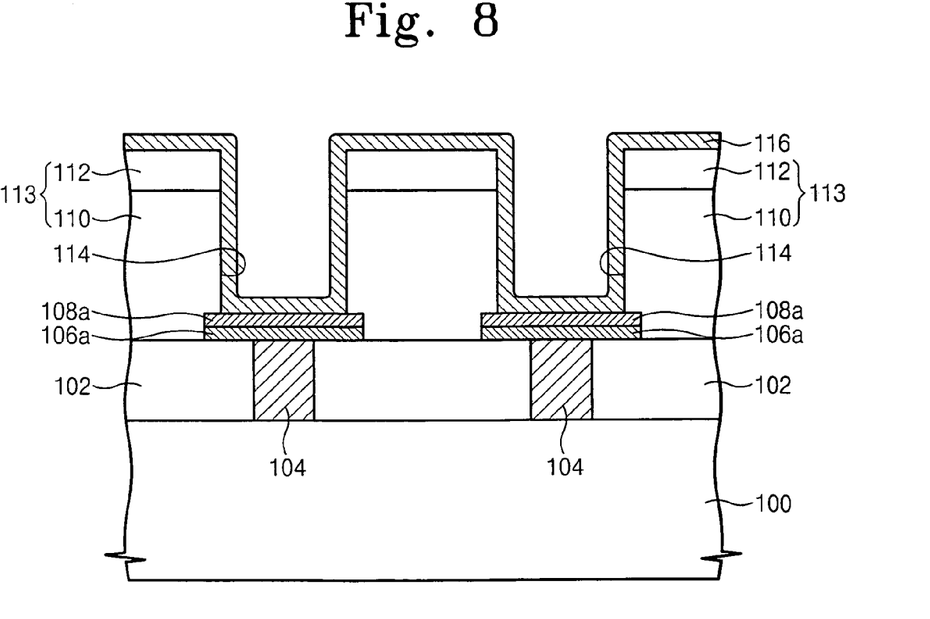

Referring to FIG. 8, the mold layer 113 is patterned to form an opening 114 exposing the upper surface of the plate electrode 108a. Next, a second conductive layer 116 is conformally formed on an entire surface of the substrate 100 having the opening 114. The second conductive layer 116 is formed conformally along a top surface of the mold layer 113 and sidewalls and onto the plate electrode 108a along a bottom surface of the opening 114. The second conductive layer 116 is formed of conductive materials including noble metals. For example, the second conductive layer 116 may be formed of a material selected from the group consisting of Palladium (Pd), Ruthenium (Ru), Platinum (Pt), Iridium (Ir), Iridium oxide (IrO2), and Ruthenium oxide (RuO2) or a combination thereof.

Figure 9:
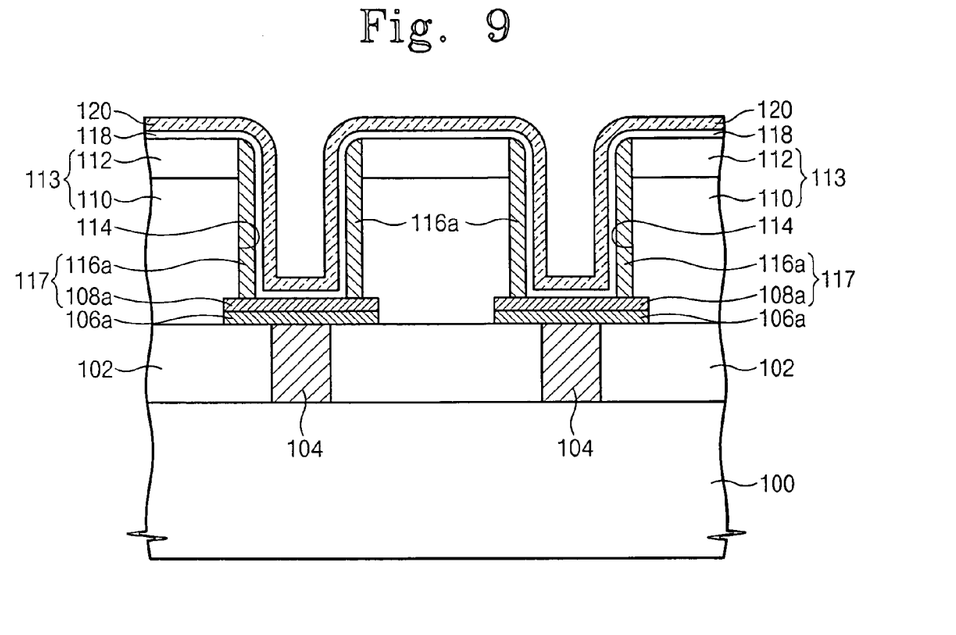

Referring to FIG. 9, a spacer-shaped sidewall electrode 116a is formed by applying a conductive material over the entire surface of the substrate to form the second conductive layer 116. In this case, the area of second conductive layer 116 formed on a top surface of the mold layer 113 is removed selectively by anisotropic plasma etching, thereby leaving the sidewall electrode 116a. The plate electrode 108a and the sidewall electrode 116a compose a lower electrode 117 of a capacitor.

The lower electrode 117 is formed of plasma etching processes. That is, the plate electrode 108a is formed of a patterning process including a photolithographic process and a plasma anisotropic etch process. The sidewall electrode 116a is formed by a plasma entire surface anisotropic etch process. The conductive materials including noble metals are easily etched by the plasma etch processes. Therefore, the process for forming the lower electrode 117 does not require a conventional CMP process. As a result, pattern defects or/and bridge of lower electrodes due to the conventional CMP process can be prevented. That is, semiconductor devices having an MIM capacitor can be fabricated without defects, such that yield is improved.

A conformal dielectric layer 118 is formed on an entire surface of a substrate 100 having the lower electrode 117. A third conductive layer 120 is formed on the dielectric layer 118. The dielectric layer 118 may be formed of a high-k dielectric having a dielectric constant higher than that of the silicon nitride layer. For instance, the dielectric layer 118 may be a single layer or a multilayer comprised of ferroelectric layer like PZT, SBT, or BLT. An oxygen ambient annealing process may be applied to the deposited dielectric layer 118.

The third conductive layer 120 may be formed of conductive materials including noble metals. For example, the third conductive layer 120 may be formed of a material selected from the group consisting of Palladium (Pd), Ruthenium (Ru), Platinum (Pt), Iridium (Ir), Iridium oxide (IrO2), and Ruthenium oxide (RuO2) or a combination thereof.

The growth-promote insulation layer 112 can be an insulation layer capable of promoting a growth of the dielectric layer 118. In addition, the growth-promote insulation layer (112) may be formed of an insulation layer that is not reactive with the dielectric layer 118. For example, the growth-promote insulation layer 112 can be formed of aluminum oxide or titanium oxide.

Figure 10:
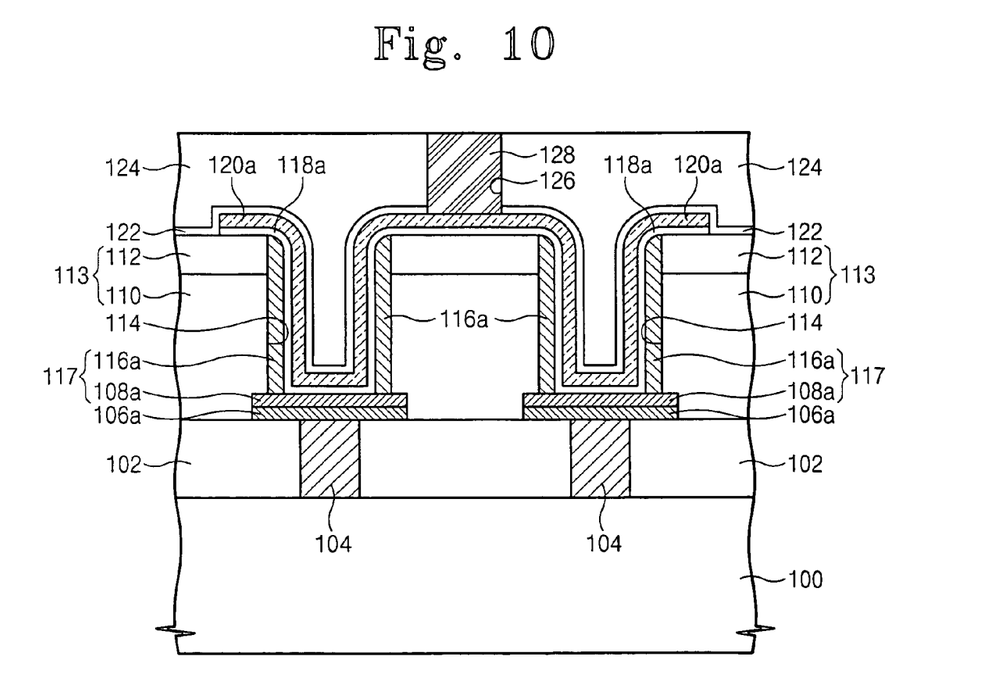

Referring to FIG. 10, the third conductive layer 120 and the dielectric layer 118 are patterned to form a dielectric pattern 118a and an upper electrode 120a that cover a bottom surface and a sidewall of the opening 114, overlying the lower electrode 117. The upper electrode 120a may be formed to have an island shape in a top plan view as illustrated in FIG. 3.

Alternatively, the third conductive layer 120 can be formed to be an upper electrode 120a' of line shape in FIG. 5 in a patterning process for forming a semiconductor device. The process steps prior to forming the upper electrode 120a' of the semiconductor device in FIG. 5 can be performed in the same manner as described above with reference to FIGS. 6 through 9.

Subsequently, referring to FIG. 10, a hydrogen diffusion barrier layer 122 may be formed over the entire surface of substrate 100 including over the upper electrode 120a. The hydrogen diffusion barrier layer 122 is an insulation layer capable of preventing the hydrogen due to a subsequent process from penetrating into the dielectric pattern 118a. For example, the hydrogen diffusion barrier layer 122 may be formed of aluminum oxide, titanium oxide, silicon nitride, or silicon oxynitride. The hydrogen diffusion barrier layer 122 may be formed on the substrate 100 having the upper electrode 120a' in FIG. 5.

An upper interlayer insulation layer 124 is formed over the entire surface of the substrate 100. The upper interlayer insulation layer 124 may be formed of silicon oxide. When the upper electrode 120a is formed conformally in the opening 114, the upper interlayer insulation layer 124 may fill the opening 114. Alternatively, the upper electrode 120a may be formed to fill the opening 114.

The upper interlayer insulation layer 124 and the hydrogen diffusion barrier layer 122 are successively patterned to form a plate contact hole 126 exposing the upper electrode 120a. The exposed portion of the upper electrode 120a may be disposed on a top surface of the mold layer 113. Therefore, the plate contact hole 126 may be formed easily because a depth of the plate contact hole 126 becomes shallow.

A plate contact plug 128 is formed to fill the plate contact hole 126. Then, a plate line 130 as illustrated in FIGS. 3 and 4 is formed on the upper interlayer insulation layer 124. The plate contact plug 128 can be an extended portion of the plate line 130 filling the plate contact hole 126.

As described above, the lower electrode of the MIM capacitor includes a plate electrode and a spacer-shaped sidewall electrode. The plate electrode is formed by a pattern process including a plasma anisotropic etch process. The sidewall electrode is formed by the plasma entire surface anisotropic etch process. Therefore, the process for forming the lower electrode does not need a conventional CMP process. As a result, pattern defects or/and bridges of lower electrodes due to the conventional CMP may be prevented. Therefore, productivity of making the semiconductor device can be largely improved.

Although the present invention has been described in connection with the embodiment of the present invention illustrated in the accompanying drawings, it is not limited thereto. It will be apparent to those skilled in the art that various substitution, modifications and changes may be thereto without departing from the scope and spirit of the invention.

What is claimed is:

1. A semiconductor device including an MIM capacitor, comprising:
    a plate electrode disposed on a substrate;
    a mold layer covering the substrate and having an opening that exposes the plate electrode;
    a sidewall electrode disposed on an inner sidewall of the opening like a spacer, electrically connecting the plate electrode; and
    a dielectric pattern and an upper electrode that sequentially cover the plate electrode and the sidewall electrode in the opening, wherein at least an upper portion of the mold layer is a growth-promote insulation layer, the growth-promote insulation layer is an insulation layer that promotes a growth of the dielectric pattern, and
    the plate electrode and the sidewall electrode compose a lower electrode.

2. The device of claim 1, wherein the lower electrode comprises a noble metal.

3. The device of claim 1, further comprising:
    a lower interlayer insulation layer interposed between the substrate and the mold layer;
    a contact plug that penetrates the lower interlayer insulation layer to contact the substrate; and
    an oxygen barrier pattern interposed between the contact plug and the plate electrode,
    wherein the oxygen barrier pattern is formed of conductive materials.

4. The device of claim 1, further comprising:
    a hydrogen diffusion barrier layer that is an insulation layer covering the upper electrode and the dielectric pattern.

5. The device of claim 1, wherein the upper electrode has a line shape in a plane view.

6. The device of claim 1, wherein the upper electrode has an island shape in a plan view and further comprises:
    an upper interlayer insulation layer covering an entire surface of the upper electrode and having a plate contact hole exposing the upper electrode; and
    a plate line disposed on the upper interlayer insulation layer and connected to the upper electrode via the plate contact hole.

7. A method of forming a semiconductor device having an MIM capacitor, comprising:
    forming a plate electrode on a substrate;
    forming a mold layer covering an entire surface of the substrate and having an opening exposing the plate electrode;
    forming a second conductive layer conformally on an entire surface of the substrate including a surface within the opening;
    forming a spacer-shaped sidewall electrode on an inner sidewall of the opening by applying a plasma entire surface anisotropic etching to the second conductive layer; and
    forming sequentially a dielectric pattern and an upper electrode that cover the plate electrode and the sidewall electrode in the opening, wherein at least an upper portion of the mold layer is a growth-promote insulation layer, the growth-promote insulation layer is an insulation layer that promotes a growth of the dielectric pattern, and
    the plate electrode and the sidewall electrode compose a lower electrode.

8. The method of claim 7, wherein the lower electrode includes noble metals.

9. The method of claim 7, wherein forming the plate electrode, further comprises:
    forming a lower interlayer insulation layer on the substrate;
    forming a contact plug contacting the substrate via the lower interlayer insulation layer; and
    forming an oxygen barrier layer and a conductive material layer covering the contact plug,
    wherein the forming of the plate electrode includes patterning successively the oxygen barrier layer and the conductive material layer using the plasma anisotropic etching.

10. The method of claim 7, after forming the upper electrode further comprising:

forming a hydrogen diffusion barrier layer covering the upper electrode and the dielectric pattern, wherein the hydrogen diffusion barrier layer is formed of an insulation layer.

11. The method of claim 7, wherein the upper electrode is formed to have a line shape in a plan view.

12. The method of claim 7, wherein the upper electrode is formed to have an island shape in a plane view and further comprises after the forming of the upper electrode:

forming an upper interlayer insulation layer covering an entire surface of the substrate having the upper electrode;

forming a plate contact hole exposing the upper electrode by patterning the upper interlayer insulation layer; and forming a plate line on the upper interlayer insulation layer, the plate line connected to the upper electrode via the plate contact hole.

13. The method of claim 7, wherein the plate electrode is formed by applying a patterning process including an anisotropic etching of a first conductive layer.

* * * * *